(12) United States Patent
Wright et al.

(10) Patent No.: US 6,614,283 B1
(45) Date of Patent: Sep. 2, 2003

(54) VOLTAGE LEVEL SHIFTER

(75) Inventors: Peter Joseph Wright, Sunnyvale, CA (US); Venkatesh P. Gopinath, Fremont, CA (US); Todd A. Randazzo, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/126,564

(22) Filed: Apr. 19, 2002

(51) Int. Cl.[7] .................................................. H03L 5/00
(52) U.S. Cl. ........................ 327/333; 327/427; 326/68; 326/81
(58) Field of Search ................................ 327/333, 309, 327/310, 327, 328, 427; 326/68, 80, 81

(56) References Cited

U.S. PATENT DOCUMENTS 6,351,173 B1 * 2/2002 Ovens et al. ................ 327/333

2002/0047740 A1 * 4/2002 Suzuki et al. ................ 327/333

* cited by examiner

Primary Examiner—Terry D. Cunningham
Assistant Examiner—Long Nguyen
(74) Attorney, Agent, or Firm—John R. Ley, L.L.C.

(57) ABSTRACT

In an integrated circuit, a voltage level shifter transitions an input signal at a first voltage level to an output signal at a second voltage level. The voltage level shifter generally includes switching elements, such as transistors, that control switching the output signal between logical zero and logical one values. The switching elements have a maximum voltage below which they can operate. The maximum voltage is less than the second voltage level. The voltage across the switching elements is limited to less than the maximum voltage.

22 Claims, 2 Drawing Sheets

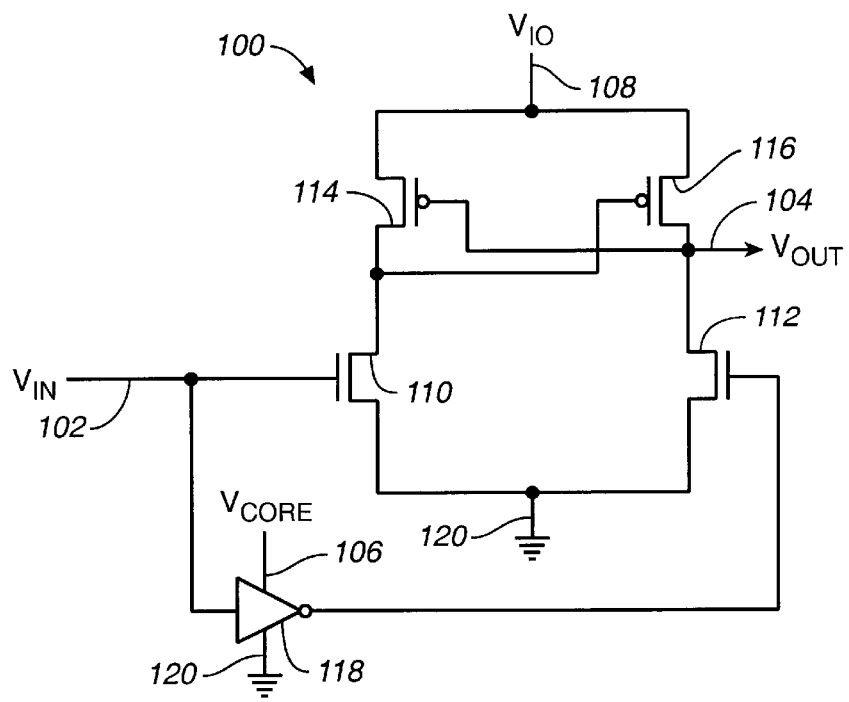
FIG._1 (PRIOR ART)
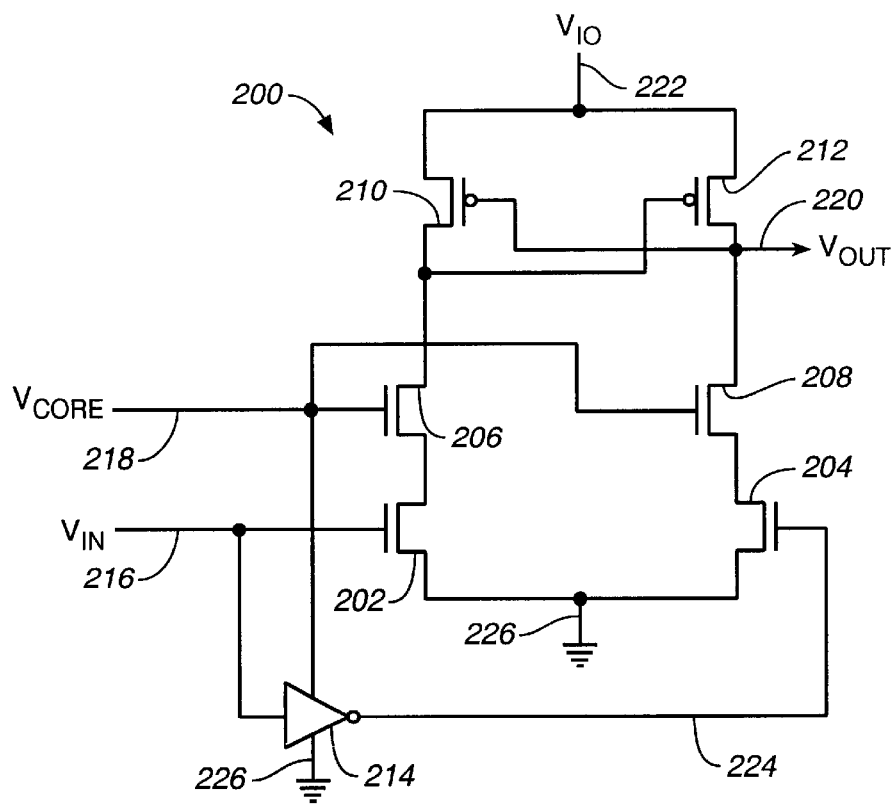
FIG._2

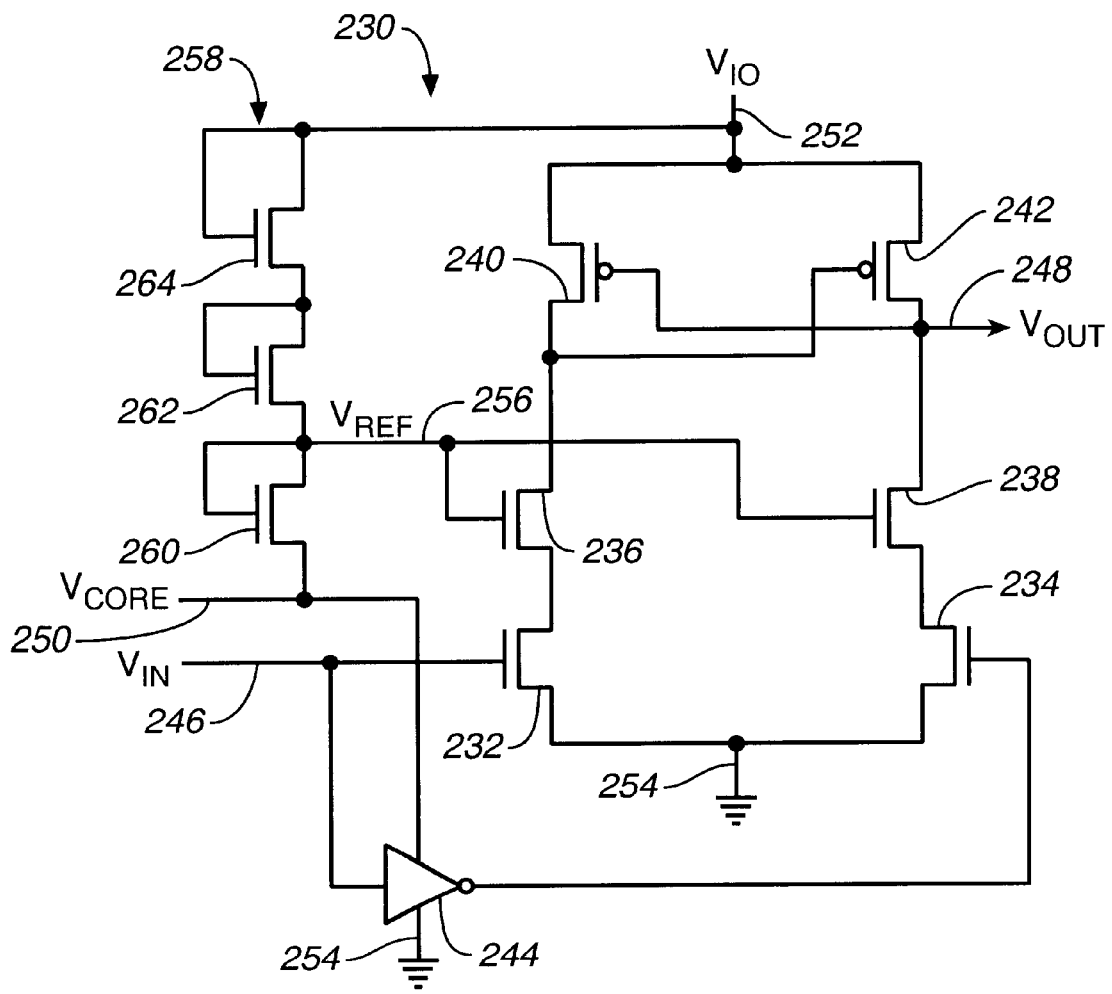
FIG._3

VOLTAGE LEVEL SHIFTER

FIELD

The subject matter herein relates to a voltage level shifter for electronic circuits, such as for translating electrical signals from within an integrated circuit (IC) to outside the IC, where the IC has an internal operating voltage at a different voltage level than an external transfer voltage.

BACKGROUND

Integrated circuits (IC's) of today typically operate internally at voltages that are lower than those used in IC's of just a few years ago. For example, a few years ago, an "internal operating voltage" of about 5.0 volts was common for many IC's. More recently, an internal operating voltage of about 3.3 volts has become common. Today, internal operating voltages of about 1.8 volts or less have come, or are coming, into use for IC's.

When two IC's having different internal operating voltages are to be used together, a voltage level shifter is used to shift one of the IC's output signals from the IC's internal operating voltage to that of the other IC. Since newer IC's are typically designed to be compatible with older, "legacy," IC's, the voltage level shifter is commonly incorporated into the newer IC's.

A newer IC may have a lower internal operating voltage at which most of the functions of the IC operate and a higher "external transfer voltage" at which output signals are transferred to other IC's. The voltage level shifter, thus, transitions the output signals from the lower internal operating voltage to the higher external transfer voltage. Additionally, input signals are typically shifted by the IC from the higher external transfer voltage to the lower internal operating voltage.

An exemplary prior art voltage level shifter 100, as shown in FIG. 1, receives an input signal $V_{IN}$ 102, typically a digital signal operating at a given clock frequency and voltage level, and produces therefrom an output signal $V_{OUT}$ 104 at the same frequency, but a higher voltage level. The input signal $V_{IN}$ 102 is supplied by internal core IC circuitry (not shown), performing the normal functions of the IC (not shown). The output signal $V_{OUT}$ 104 is supplied to output pins (not shown), which connect to other circuitry or IC's (not shown), possibly through a printed circuit board (not shown). Additionally, a logic one value for the digital input signal $V_{IN}$ 102 has about the same voltage level as a core voltage $V_{CORE}$ 106, i.e. the internal operating voltage, used to power the internal core IC circuitry. A logic one value for the digital output signal $V_{OUT}$ 104 has about the same voltage level as an I/O (input/output) voltage $V_{IO}$ 108, i.e. the external transfer voltage, used to power the I/O functions of the IC.

The voltage level shifter 100 includes thick oxide N-MOSFET transistors 110 and 112, thick oxide P-MOSFET transistors 114 and 116 and a thin oxide inverter 118. The sources of the transistors 110 and 112 are connected to ground 120. The drains of the transistors 110 and 112 are connected to the drains of the transistors 114 and 116, respectively. The sources of the transistors 114 and 116 are connected to the I/O voltage 108. The drain of the transistor 110 is also connected to the gate of the transistor 116. The drain of the transistor 112 is connected to the gate of the transistor 114 and also supplies the output signal 104. The inverter 118 is connected to the core voltage 106 and to the ground 120.

The input signal 102 is supplied to the gate of the transistor 110 and to the input of the inverter 118. The inverter 118, powered by the core voltage 106, inverts the input signal 102. The inverted input signal 102 is supplied to the gate of the transistor 112.

Therefore, when the input signal 102 is at a logic zero (i.e. approximately zero volts), the logic zero at the gate of the transistor 110 causes the transistor 110 to turn "off," and the inverted input signal 102 (i.e. logic one) at the gate of the transistor 112 causes the transistor 112 to turn "on." Since the transistor 112 is "on," the drain of the transistor 112 (and, thus, the output signal 104 and the gate of the transistor 114) is "pulled down" to approximately ground, or zero volts or logic zero. The logic zero on the gate of the transistor 114, thus, turns "on" the transistor 114, so the drain of the transistor 114 (and the gate of the transistor 116) is "pulled up" to the voltage level of the I/O voltage 108, i.e. a logic one. The logic one on the gate of the transistor 116, thus, turns "off" the transistor 116, so as not to interfere with the logic zero on the drain of the transistor 112 and the output signal 104.

On the other hand, when the input signal 102 is at a logic one (i.e. the internal operating voltage), the logic one at the gate of the transistor 110 causes the transistor 110 to turn "on," and the inverted input signal 102 (i.e. logic zero) at the gate of the transistor 112 causes the transistor 112 to turn "off." Since the transistor 110 is "on," the drain of the transistor 110 (and, thus, the gate of the transistor 116) is "pulled down" to approximately ground, or zero volts or logic zero. The logic zero on the gate of the transistor 116, thus, turns "on" the transistor 116, so the drain of the transistor 116 (and, thus, the output signal 104 and the gate of the transistor 114) is "pulled up" to the voltage level of the I/O voltage, 108 (i.e. a logic one at the external transfer voltage). The logic one on the gate of the transistor 114, thus, turns "off" the transistor 114, so as not to interfere with the logic zero on the drain of the transistor 110 and the gate of the transistor 116.

With the lower internal operating voltages and higher clock frequencies coming into use with many IC's, the thick oxide N-MOSFET transistors 110 and 112 cannot perform adequately. The internal operating voltages, for example, are becoming so low that they are approaching the "threshold voltage" of the transistors 110 and 112. The threshold voltage of a transistor is the minimum voltage that can be applied to the gate of the transistor to activate the transistor. Therefore, if the internal operating voltage (i.e. the logic one voltage of the input signal 102) becomes as low as the threshold voltage of the transistors 110 and 112, then the transistors 110 and 112 cannot be activated and the voltage level shifter 100 will not operate. Additionally, if the logic on& voltage level of the input signal 102 is relatively larger than the threshold voltage of the transistors 110 and 112, then the transistors 110 and 112 can be turned on relatively fast. However, if the logic one voltage level of the input signal 102 is relatively close to the threshold voltage of the transistors 110 and 112, then the transistors 110 and 112 will switch from "off" to "on" relatively slowly. In this case, the transistors 110 and 112 cannot be activated quickly enough for the desired clock frequency of the IC, and the voltage level shifter 100 will not operate.

It is with respect to these and other background considerations that the subject matter herein has evolved.

SUMMARY

The subject matter described herein involves an integrated circuit (IC) having a voltage level shifter capable of operating with the lower internal operating voltages and higher clock frequencies used by current and upcoming IC's. The transistors (i.e. "switching transistors") within the voltage level shifter that are activated, or "switched on and off," by the internal operating voltage of the IC incorporate a thinner oxide than in the prior art. Therefore, the threshold voltage of the switching transistors is lower than the thicker-oxide transistors in the prior art, so the internal operating voltage required to turn "on," or "activate," the switching transistors is lower than the voltage required to turn "on" the transistors in the prior art. Additionally, the frequency at which the switching transistors can be switched "on" and "off" at this voltage is higher than that for the transistors in the prior art at this voltage.

Also, the switching transistors have a maximum voltage below which they can operate that is less than the external transfer voltage of the IC. Therefore, additional transistors are placed in the current path between the switching transistors and the I/O voltage source in order to limit the voltage drop across the gate oxide (i.e. from the drain to the source) of the switching transistors. The reduced voltage across the gate oxide prevents the switching transistors from "failing" due to the presence of the external transfer voltage on the drain of the switching transistors.

A more complete appreciation of the present disclosure and its scope, and the manner in which it achieves the above noted improvements, can be obtained by reference to the following detailed description of presently preferred embodiments taken in connection with the accompanying drawings, which are briefly summarized below, and the appended claims.

BRIEF DESCRIPTION OF THE DRAWINGS

FIG. 1 is a schematic diagram of a prior art voltage level shifter.

FIG. 2 is a schematic diagram of an improved voltage level shifter.

FIG. 3 is a schematic diagram of an alternative improved voltage level shifter.

DETAILED DESCRIPTION

A voltage level shifter 200, as shown in FIG. 2, generally includes thin oxide N-MOSFET transistors 202 and 204, thick or medium oxide N-MOSFET transistors 206 and 208, thick oxide P-MOSFET transistors 210 and 212 and a thin oxide inverter 214. A digital input signal ($V_{IN}$) 216 having a maximum voltage level about the same as an internal operating voltage ($V_{CORE}$) 218 is supplied to the voltage level shifter 200. From the digital input signal 216, the voltage level shifter 200 generates a digital output signal 220 having a maximum voltage level about the same as an external transfer, or input/output (I/O), voltage ($V_{IO}$) 222.

The internal operating voltage 218 is the voltage that operates most of the components (not shown) of an IC (not shown) of which the voltage level shifter 200 is a part. The digital input signal 216 is an output signal generated by the other components of the IC to be output from the IC. The voltage level shifter 200 uses the digital input signal 216 to generate the digital output signal 220, which is the actual signal output by the IC. The digital output signal 220 includes logical one values at the voltage level of the external transfer voltage 222 in order to interface with other external circuitry or IC's (not shown).

The digital input signal 216 is applied to the gate of the transistor 202 and to the inverter 214. The inverter 214 inverts the digital input signal 216 into an inverted digital input signal 224 and supplies the inverted digital input signal 224 to the gate of the transistor 204.

Since the transistors 202 and 204 have a thin gate oxide, the transistors 202 and 204 can be operated (i.e. switched on and off) by the relatively low voltage level of the digital input voltage 216 (and the inverted digital input signal 224). For example, voltage levels of about 1.8 volts, 1.0 volts and less may be used by the digital input voltage 216 and the internal operating voltage 218. Additionally, the thin gate oxide of the transistors 202 and 204 enables the transistors 202 and 204 to be operated, or switched, more rapidly than the thick oxide transistors 110 and 112 (FIG. 1) used in the prior art, so the transistors 202 and 204 can handle a higher desired clock frequency for the digital input voltage 216 than could the prior art.

On the other hand, since the transistors 210 and 212 have a thick gate oxide and the transistors 206 and 208 have a thick or medium gate oxide, the transistors 206–212 can handle the higher voltage level (e.g. 3.3 volts, etc.) of the digital output voltage 220 and the external transfer voltage 222 that is typically required to interface with other IC's (not shown), particularly older IC's. Additionally, the higher voltage level of the external transfer voltage 222 can drive the thick oxide transistors 210 and 212 at the higher desired clock frequency.

The drains of the transistors 202 and 204 are connected to the sources of the transistors 206 and 208, respectively. The sources of the transistors 202 and 204 are connected to a ground 226. The drains of the transistors 206 and 208 are connected to the drains of the transistors 210 and 212, respectively. The gates of the transistors 206 and 208 are connected to the internal operating voltage 218, which also powers the inverter 214. The sources of the transistors 210 and 212 are connected to the external transfer voltage 222. The connection between the transistors 206 and 210 is also connected to the gate of the transistor 212. The connection between the transistors 208 and 212 is not only connected to the gate of the transistor 210, but also supplies the digital output voltage 220.

When the digital input signal 216 is a logic zero, the inverted digital input signal 224 is a logic one. Therefore, the transistor 202, having a logic zero at its gate, is turned "off." The other transistor 204, having a logic one at its gate, is turned "on." With the transistor 204 "on," the connection between the transistors 204 and 208 is pulled down almost to ground, or logic zero. With the internal operating voltage 218 connected to the gate of the transistor 208, the transistor 208 is always "on," so the connection between the transistors 208 and 212 is also pulled down almost to ground, or logic zero. The logic zero is thus supplied to the gate of the transistor 210 and as the digital output voltage 220. Since the transistor 210 is a P-MOSFET device, the logic zero at it's gate turns the transistor 210 "on." With the transistor 210 "on," the connection between the transistors 206 and 210 and the gate of the transistor 212 is pulled up about to the voltage level of the external transfer voltage 222. This voltage level at the gate of the transistor 212 turns "off" the transistor 212, so the external transfer voltage 222 does not interfere with the logic zero of the digital output voltage 220 through the transistor 212.

With the internal operating voltage 218 connected to the gate of the transistor 206, the transistor 206 is also always "on," but the connection between the transistors 202 and 206 is not pulled up to the external transfer voltage 222, as is the connection between the transistors 206 and 210. Instead, since the transistor 202 is turned "off," the transistor 206 functions so as to limit the voltage level at the connection between the transistors 202 and 206 to a limiting voltage at the gate of the transistor 206 (the internal operating voltage 218) minus a conventional gate-source threshold voltage of the transistor 206.

Since the transistor 202 has a relatively thin gate oxide, the maximum drain-source voltage level the transistor 202 can withstand without "breaking down," or turning "on" when it is supposed to be "off," is likely to be less than the external transfer voltage 222. Therefore, the voltage-limiting function of the transistor 206 protects the transistor 202, so that the transistor 202 can properly perform its switching function in response to the digital input signal 216.

When the digital input signal 216 is a logic one, the inverted digital input signal 224 is a logic zero. Therefore, the transistor 204, having a logic zero at its gate, is turned "off." The other transistor 202, having a logic one at its gate, is turned "on." With the transistor 202 "on," the connection between the transistors 202 and 206 is pulled down almost to ground, or logic zero. With the transistor 206 always "on," the connection between the transistors 206 and 210 is also pulled down almost to ground, or logic zero. The logic zero is thus supplied to the gate of the transistor 212. Since the transistor 212 is a P-MOSFET device, the logic zero at it's gate turns the transistor 212 "on." With the transistor 212 "on," the connection between the transistors 208 and 212, the gate of the transistor 210 and the digital output voltage 220 are pulled up about to the voltage level of the external transfer voltage 222. Therefore, for the digital output voltage 220, the voltage level of the external transfer voltage 222 is a logic one value. This voltage level at the gate of the transistor 210 turns "off" the transistor 210, so the external transfer voltage 222 does not passed through the transistor 210 and does not interfere with the logic zero at the gate of the transistor 212. Likewise, since the transistor 204 is "off," the ground 226 does not interfere with the voltage level of the digital output signal 220.

Although the transistor 208 is also always "on," the connection between the transistors 204 and 208 is not pulled up to the external transfer voltage 222, as is the connection between the transistors 208 and 212 and the digital output voltage 220. Instead, since the transistor 204 is turned "off," the transistor 208 functions so as to limit the voltage level at the connection between the transistors 204 and 208 to a limiting voltage at the gate of the transistor 208 (the internal operating voltage 218) minus a conventional gate-source threshold voltage of the transistor 208.

Like the transistor 202, since the transistor 204 has a relatively thin gate oxide, the maximum drain-source voltage level the transistor 204 can withstand without "breaking down," or turning "on" when it is supposed to be "off," is likely to be less than the external transfer voltage 222. Therefore, the voltage-limiting function of the transistor 208 protects the transistor 204, so that the transistor 204 can properly perform its switching function in response to the inverted digital input signal 224.

Another embodiment for a voltage level shifter 230, as shown in FIG. 3, generally includes switching N-MOSFET transistors 232 and 234, thick or medium oxide voltage-limiting N-MOSFET transistors 236 and 238 and P-MOSFET transistors 240 and 242 similar to the transistors 202–212 (FIG. 2), respectively. The voltage level shifter 230 also includes an inverter 244 similar to the inverter 214 (FIG. 2). The voltage level shifter 230 also includes an input digital voltage 246 similar to the input digital voltage. 216 (FIG. 2), a digital output voltage 248 similar to the digital output voltage 220 (FIG. 2), an internal operating voltage 250 similar to the internal operating voltage 218 (FIG. 2), an external transfer voltage 252 similar to the external transfer voltage 222 (FIG. 2) and a ground 254 similar to the ground 226 (FIG. 2).

The function of the above described components of the voltage level shifter 230 is similar as for the voltage level shifter 200 (FIG. 2), except that the internal operating voltage 250 is not applied to the gates of the voltage-limiting transistors 236 and 238. Instead, a reference voltage ($V_{REF}$) 256 is applied to the gates of the transistors 236 and 238. The reference voltage 256 is generated from the internal operating voltage 250, the external transfer voltage 252 and a "transistor totem pole" 258.

The transistor totem pole 258 may include any appropriate number and type of transistors connected together. The illustrated example includes three transistors 260, 262 and 264. The gate and drain of the transistors 260–264 are connected together and to the source of the next transistor in the transistor totem pole 258. The source of the bottom transistor 260 is connected to the internal operating voltage 250. The gate and drain of the top transistor 264 are connected to the external transfer voltage 252. The reference voltage 256 is generated at the connection between the bottom and middle transistors 260 and 262.

The transistor totem pole 258 functions similarly to a voltage divider in which the voltage level of the reference voltage 256 depends on the number and characteristics of the transistors between the reference voltage 256 and the internal operating voltage 250 and the number and characteristics of the transistors between the reference voltage 256 and the external transfer voltage 252. Generally, the number of transistors in the transistor totem pole 258 depends on the difference between the voltage levels of the external transfer voltage 252 and the internal operating voltage 250 and the desired voltage level for the reference voltage 256.

In the embodiment shown, the reference voltage 256 has a voltage level of the internal operating voltage 250 plus the gate-to-source threshold voltage of the bottom transistor 260. In a particular embodiment, the bottom transistor 260 and the voltage-limiting transistors 236 and 238 are similar in that they have approximately the same gate-to-source threshold voltage. In this manner, the voltage level at the connection between the transistors 232 and 236 when the transistor 232 is "off" (and at the connection between the transistors 234 and 238 with the transistor 234 is "off") is approximately the internal operating voltage 250. In other words, the reference voltage 256 is stepped up from the internal operating voltage 250 by the transistor 260 by about the same amount that the voltage level at the connection between the transistors 232 and 236 (and between the transistors 234 and 238) is stepped down from the reference voltage 256 by the transistor 236 (and the transistor 238).

The limiting voltage (the internal operating voltage 250 plus the gate-to-source threshold voltage of the bottom transistor 260) applied to the gates of the transistors 236 and 238 is greater than the limiting voltage (the internal operating voltage 218, FIG. 2) applied to the gates of the transistors 206 and 208 (FIG. 2). The greater limiting voltage enables the voltage-limiting transistors 236 and 238 to be driven "on" more strongly than are the voltage-limiting transistors 206 and 208. Therefore, the voltage level between the transistors 232 and 236 when the transistor 232 is "off" (and between the transistors 234 and 238 when the transistor 234 is "off") is greater than the voltage level between the transistors 202 and 206 or 204 and 208 (FIG. 2). The greater voltage level between the transistors 232 and 236 and between the transistors 234 and 238 enables the switching transistors 232 and 234 to be driven from "off" to "on" more rapidly than are the transistors 202 and 204. Care must still be taken to ensure that the drain-to-source voltage across the transistors 232 and 234 does not exceed the maximum permissible voltage for the transistors 232 and 234. With this embodiment, however, the voltage level shifter 230 can operate more rapidly than can the voltage level shifter 200 (FIG. 2).

The voltage level shifters 200 (FIG. 2) and 230 (FIG. 3) have the advantage of operating with the lower internal operating voltages that are in use or coming into use with current and upcoming IC's while still shifting the digital signals to the higher external transfer voltages needed to maintain compatibility with legacy IC's. The voltage level shifter 230 has the further advantage over the voltage level shifter 200 of being able to operate at higher frequencies due to the higher limiting voltage, i.e. the reference voltage 256 (FIG. 3), as opposed to the internal operating voltage 218 (FIG. 2).

Presently preferred embodiments of the subject matter herein and its improvements have been described with a degree of particularity. This description has been made by way of preferred example. It should be understood that the scope of the claimed subject matter is defined by the following claims, and should not be unnecessarily limited by the detailed description of the preferred embodiments set forth above.

What is claimed is:

1. In a voltage level shifter for shifting a digital high input signal to a digital high output signal which has a different voltage level than the voltage level of the digital high input signal, the voltage level shifter connected to and operative relative to an internal voltage level at an internal voltage node and an I/O voltage level at an I/O voltage node and a ground voltage level at a ground voltage node and a reference voltage at a reference circuit element, the voltage level shifter comprising first and second switching transistors and first and second voltage limiting transistors and first and second isolating transistors each of which has a source and a gate and a drain, the gates of each transistor comprising a layer of oxide having a predetermined thickness, the voltage level shifter further including an inverter receptive of the digital input signal and operative to create an inverted digital input signal which is a logical inverse of the digital input signal; wherein the source of the first switching transistor is connected to the ground voltage node, the gate of the first switching transistor is connected to receive the digital input signal, the drain of the first switching transistor is connected to the source of the first voltage limiting transistor, the gate of the first voltage limiting transistor is connected to the reference circuit element, the drain of the first isolating transistor is connected to the drain of the first voltage limiting transistor, the source of the first isolating transistor is connected to the I/O voltage node, the source of the second switching transistor is connected to the ground voltage node, the gate of the second switching transistor is connected to receive the inverted digital input signal, the drain of the second switching transistor is connected to the source of the second voltage limiting transistor, the gate of the second voltage limiting transistor is connected to the reference circuit element, the drain of the second isolating transistor is connected to the drain of the second voltage limiting transistor, the source of the second isolating transistor is connected to the I/O voltage node, the gate of the first isolating transistor is connected to the drains of the second voltage limiting and isolating transistors and to the digital output signal, and the gate of the second isolating transistor is connected to the drains of the first voltage limiting and isolating transistors; and an improvement in combination therewith, wherein:

the predetermined thickness of the layer of oxide of the gates of the first and second voltage limiting transistors is greater than the predetermined thickness of the layer of oxide of the first and second switching transistors; and the predetermined thickness of the layer of oxide of the gates of the first and second isolating transistors is greater than the predetermined thickness of the layer of oxide of the first and second voltage limiting transistors.

2. A voltage level shifter as defined in claim 1, wherein:
the predetermined thicknesses of the layers of oxide of the gates of the first and second switching transistors are approximately equal.

3. A voltage level shifter as defined in claim 1, wherein:
the predetermined thicknesses of the layers of oxide of the gates of the first and second voltage limiting transistors are approximately equal.

4. A voltage level shifter as defined in claim 1, wherein:
the predetermined thicknesses of the layers of oxide of the gates of the first and second isolating transistors are approximately equal.

5. A voltage level shifter as defined in claim 1, wherein:
the predetermined thicknesses of the layers of oxide of the gates of the first and second switching transistors are approximately equal;
the predetermined thicknesses of the layers of oxide of the gates of the first and second voltage limiting transistors are approximately equal; and
the predetermined thicknesses of the layers of oxide of the gates of the first and second isolating transistors are approximately equal.

6. A voltage level shifter as defined in claim 1, wherein:
the transistors are one of either an N type conductivity or a P type conductivity, and the drains and the sources of the transistors are established in relation to type of conductivity of the transistor.

7. A voltage level shifter as defined in claim 6, wherein:
the first and second switching transistors and the first and second voltage limiting transistors are of one type of conductivity, and the first and second isolating transistors are of the other type of conductivity.

8. A voltage level shifter as defined in claim 7, wherein:
the first and second switching transistors are both of the same type of conductivity;
the first and second voltage limiting transistors are of both the same type of conductivity; and
the first and second isolating transistors are both of the same type of conductivity.

9. A voltage level shifter as defined in claim 6, wherein:
the first and second switching transistors are both of the same type of conductivity;
the first and second voltage limiting transistors are of both the same type of conductivity; and
the first and second isolating transistors are both of the same type of conductivity.

10. A voltage level shifter as defined in claim 1, wherein:
the reference circuit element comprises a transistor connected to the internal voltage node and the I/O voltage node.

11. A voltage level shifter as defined in claim 1, wherein:

the reference circuit element comprises a series of transistors connected to the internal voltage node and the I/O voltage node.

12. A method of shifting a voltage level from a digital high input signal to a digital high output signal which has a different voltage level than the voltage level of the digital high input signal with a voltage level shifter which operates relative to an internal voltage level at an internal voltage node and an I/O voltage level at an I/O voltage node and a ground voltage level at a ground voltage node and a reference voltage at a reference circuit element, the voltage level shifter including first and second switching transistors and first and second voltage limiting transistors and first and second isolating transistors each of which has a source and a gate and a drain, the gates of each transistor establishing predetermined withstand voltages, the voltage level shifter further including an inverter receptive of the digital input signal and operative to create an inverted digital input signal which is a logical inverse of the digital input signal; wherein the source of the first switching transistor is connected to the ground voltage node, the gate of the first switching transistor is connected to receive the digital input signal, the drain of the first switching transistor is connected to the source of the first voltage limiting transistor, the gate of the first voltage limiting transistor is connected to the reference circuit element, the drain of the first isolating transistor is connected to the drain of the first voltage limiting transistor, the source of the first isolating transistor is connected to the I/O voltage node, the source of the second switching transistor is connected to the ground voltage node, the gate of the second switching transistor is connected to receive the inverted digital input signal, the drain of the second switching transistor is connected to the source of the second voltage limiting transistor, the gate of the second voltage limiting transistor is connected to the reference circuit element, the drain of the second isolating transistor is connected to the drain of the second voltage limiting transistor, the source of the second isolating transistor is connected to the I/O voltage node, the gate of the first isolating transistor is connected to the drains of the second voltage limiting and isolating transistors and to the digital output signal, and the gate of the second isolating transistor is connected to the drains of the first voltage limiting and isolating transistors; and wherein said method of shifting the voltage level further comprises:

establishing the predetermined withstand voltages of the voltage limiting transistors greater than the predetermined withstand voltages of the switching transistors; and establishing the withstand voltages of the isolating transistors greater than the predetermined withstand voltages of the voltage limiting transistors.

13. A method as defined in claim 12, further comprising:

establishing approximately equal predetermined withstand voltages for the first and second switching transistors.

14. A method as defined in claim 12, further comprising:

establishing approximately equal predetermined withstand voltages for the first and second voltage limiting transistors.

15. A method as defined in claim 12, further comprising:

establishing approximately equal predetermined withstand voltages for the first and second isolating transistors.

16. A method as defined in claim 12, further comprising:

establishing approximately equal predetermined withstand voltages for the first and second switching transistors;

establishing approximately equal predetermined withstand voltages for the first and second voltage limiting transistors; and establishing approximately equal predetermined withstand voltages for the first and second isolating transistors.

17. A method as defined in claim 12, wherein the transistors are one of either an N type conductivity or a P type conductivity, and further comprising:

connecting the drains and the sources of the transistors in relation to type of conductivity of the transistors.

18. A method as defined in claim 17, further comprising:

using first and second switching transistors and first and second voltage limiting transistors of one type of conductivity; and using first and second isolating transistors of the other type of conductivity.

19. A method as defined in claim 18, further comprising:

using first and second switching transistors of the same type of conductivity;

using first and second voltage limiting transistors of the same type of conductivity; and using first and second isolating transistors of the same type of conductivity.

20. A method as defined in claim 17, further comprising:

using first and second switching transistors of the same type of conductivity;

using first and second voltage limiting transistors of the same type of conductivity; and using first and second isolating transistors of the same type of conductivity.

21. A method as defined in claim 12, further comprising:

using a transistor connected to the internal voltage node and the I/O voltage node as the reference circuit element.

22. A method as defined in claim 12, further comprising:

using a series of transistors connected to the internal voltage node and the I/O voltage node as the reference circuit element.

* * * * *